United States Patent
Lin et al.

[11] Patent Number: 5,976,969
[45] Date of Patent: *Nov. 2, 1999

[54] METHOD FOR FORMING AN ALUMINUM CONTACT

[75] Inventors: Yih-Shung Lin, Plano; Fu-Tai Liou, Carrollton, both of Tex.

[73] Assignee: STMicroelectronics, Inc., Carrollton, Tex.

[ * ] Notice: This patent is subject to a terminal disclaimer.

[21] Appl. No.: 08/883,808

[22] Filed: Jun. 27, 1997

Related U.S. Application Data

[60] Division of application No. 08/159,448, Nov. 30, 1993, Pat. No. 5,658,828, which is a continuation-in-part of application No. 08/124,836, Sep. 21, 1993, which is a continuation of application No. 07/443,898, Nov. 30, 1989, and application No. 08/146,825, Nov. 1, 1993, which is a continuation of application No. 07/835,731, Feb. 2, 1992, which is a continuation of application No. 07/609,883, Nov. 5, 1990, Pat. No. 5,108,951, and application No. 07/948,690, Sep. 22, 1992.

[51] Int. Cl.⁶ ............................................. H01L 21/4763
[52] U.S. Cl. .................................... 438/629; 438/688
[58] Field of Search .................................. 438/627, 629, 438/637, 643, 688

[56] References Cited

U.S. PATENT DOCUMENTS

| | | | |
|---|---|---|---|
| 3,158,504 | 11/1964 | Anderson | 437/188 |
| 3,900,598 | 8/1975 | Hall et al. | 437/195 |

(List continued on next page.)

FOREIGN PATENT DOCUMENTS

| | | |
|---|---|---|
| 0 107 259 | 5/1984 | European Pat. Off. |
| 0 132 720 | 2/1985 | European Pat. Off. |
| 0 137 701 | 4/1985 | European Pat. Off. |
| 0 168 828 | 1/1986 | European Pat. Off. |
| 0 257 277 | 3/1988 | European Pat. Off. |
| 0 269 019 | 6/1988 | European Pat. Off. |
| 0 273 715 | 7/1988 | European Pat. Off. |
| 0 276 087 | 7/1988 | European Pat. Off. |
| 0 310 108 | 4/1989 | European Pat. Off. |
| 0 329 227 | 8/1989 | European Pat. Off. |
| 0 351 001 | 1/1990 | European Pat. Off. |
| 0 430 403 | 6/1991 | European Pat. Off. |
| 0 451 571 | 10/1991 | European Pat. Off. |
| 0 488 264 | 6/1992 | European Pat. Off. |
| 0 488 628 | 6/1992 | European Pat. Off. |
| 0 499 241 | 8/1992 | European Pat. Off. |
| 52 137 948 | 11/1977 | Japan. |
| 0 071 564 | 8/1979 | Japan. |
| 0 139 939 | 8/1982 | Japan. |
| 0 046 641 | 3/1983 | Japan. |
| 0 227 446 | 11/1985 | Japan. |
| 0 142 739 | 6/1986 | Japan. |
| 0 124 447 | 5/1988 | Japan. |
| 0 136 547 | 6/1988 | Japan. |
| 0 137 230 | 11/1988 | Japan. |
| 0 160 036 | 6/1989 | Japan. |
| 62 232 334 | 7/1989 | Japan. |
| 077 122 | 9/1989 | Japan. |
| 2 112 566 | 7/1983 | United Kingdom. |
| 2 128 636 | 5/1984 | United Kingdom. |

OTHER PUBLICATIONS

"TiN Metallization Barriers: From 1.2μ to 0.35μ Technology" Fabio Pintchovski and Ed Travis, Motorola, Inc., Austin, Texas, pp. 777–786, 1992 Materials Research Society.

(List continued on next page.)

*Primary Examiner*—Chandra Chaudhari
*Attorney, Agent, or Firm*—Theodore E. Galanthay; Lisa K. Jorgenson; Dan Venglarik

[57] ABSTRACT

A method for forming an aluminum contact through an insulating layer includes the formation of an opening. A barrier layer is formed, if necessary, over the insulating layer and in the opening. A thin refractory metal layer is then formed over the barrier layer, and aluminum deposited over the refractory metal layer. Proper selection of the refractory metal layer and aluminum deposition conditions allows the aluminum to flow into the contact and completely fill it. Preferably, the aluminum is deposited over the refractory metal layer without breaking vacuum.

7 Claims, 2 Drawing Sheets

U.S. PATENT DOCUMENTS

| | | | |
|---|---|---|---|
| 4,107,726 | 8/1978 | Schilling | 257/763 |
| 4,436,582 | 3/1984 | Saxena | 437/192 |
| 4,502,209 | 3/1985 | Eizenberg et al. | 437/190 |
| 4,566,177 | 1/1986 | van de Ven et al. | 437/194 |
| 4,592,802 | 6/1986 | Deleonibus et al. | 437/192 |
| 4,661,228 | 4/1987 | Mintz | 204/192.25 |
| 4,756,810 | 7/1988 | Lamont | 204/192.3 |
| 4,759,533 | 7/1988 | Magee et al. | 437/194 |
| 4,772,571 | 9/1988 | Scovell et al. | 437/197 |
| 4,837,183 | 6/1989 | Polito et al. | 437/197 |
| 4,892,844 | 1/1990 | Cheung et al. | 437/194 |
| 4,944,961 | 7/1990 | Lu | 427/314 |
| 4,970,176 | 11/1990 | Tracy et al. | 437/197 |
| 4,975,389 | 12/1990 | Ryan et al. | 437/197 |
| 4,976,839 | 12/1990 | Inoue | 204/192.17 |
| 4,988,423 | 1/1991 | Yamamoto et al. | 437/194 |
| 4,994,162 | 2/1991 | Armstrong et al. | 204/192.15 |
| 5,106,781 | 4/1992 | Penning de Vries | 437/194 |
| 5,108,570 | 4/1992 | Wang | 204/192.3 |
| 5,108,951 | 4/1992 | Chen et al. | 437/94 |

OTHER PUBLICATIONS

"Development of Planarized Al–Sl Contact Filling Technology," Hisako Ono, et al., VMIC Conference, Jun. 1990, pp. 76–82.

"Aluminum Metallization for ULSI," Dipanker Pramanik et al., Solid State Technology, Mar. 1990, No. 3, Westford, MA, pp. 73–79.

"Thin–Film Reactions of Al with Co, Cr, Mo, Ta, Ti and W," E.G. Golgan, et al., vol. 4, 1989 Materials Research Society, pp. 815–820.

"Planarized Aluminum Deposition on TiW and TiN Layers by High Temperature Evaporation," G.E. Georgiou et al., AT&T Bell Laboratories, Jun. 1989 VMIC Conference, pp. 315–321.

"The Properties of Aluminum Thin Films Sputter Deposited at Elevated Temperatures," M. Inoue et al., J. Vac. Sci. Technol., May 6, 1988, pp. 1636–1939.

"Evaluation of Titanium as a Diffusion Barrier Between Aluminum and Silicon for 1.2 $\mu$m CMOS Integrated Circuits," M. Farahani et al., Electrochemical Society Active Member, pp. 2835–2845.

"Nonconformal Al Via Filling and Planarization by Partially Ionized Beam Deposition for Multilevel Interconnection," S.N. Mei et al., 1987 IEEE, pp. 503–505.

"Aluminum Alloy Planarization for Topography Control of Multi–Level VLSI Interconnect," van Gogh et al., 1987 IEEE, pp. 371–375.

"Interconnect Materials for VLSI Circuits," Y. Pauleau, Centre National d'Etudes des Telecommunications, Meylan, France, 1987, pp. 155–162, Solid State Technology.

"Planarization of Al Alloy Film During High Rate Sputtering," V. Hoffman et al., Mar. 1986, Report No. 122, pp. 1–20.

"Sputtering and Interconnect Trends," Peter Burggraaf, Semiconductor International, Nov. 1984, pp. 70–73.

"TiN Formed by Evaporation as a Diffusion Barrier Between Al and Si," C.Y. Ting, IBM T.J. Watson Research Center, Yorktown Heights, New York 10598, May 6, 1982, pp. 14–18.

"High–Temperature Contact Structures for Silicon Semiconductor Devices," M. Wittmer, Brown Boveri Research Center, 5405 Baden–Dattwil, Switzerland, Sep. 1980 pp. 540–542.

"Silicon Processing for the VLSI Era," S. Wolf et al., Lattice Press, Inc., 1986, pp. 332–334.

METHOD FOR FORMING AN ALUMINUM CONTACT

CROSS REFERENCE TO RELATED APPLICATIONS

This is a Division of application Ser. No. 08/159,448, filed Nov. 30, 1993, now U.S. Pat. No. 5,658,828, which is a continuation-in-part of Ser. No. 08/124,836, filed Sep. 21, 1993, titled METHOD FOR FABRICATING INTERLEVEL CONTACTS, which is a continuation of Ser. No. 07/443,898, filed Nov. 30, 1989, and of Ser. No. 08/146,825, filed Nov. 1, 1993, titled METHOD FOR FORMING A METAL CONTACT, which is a continuation of Ser. No. 07/835,731, filed Feb. 2, 1992, which is a continuation of Ser. No. 07/609,883, filed November 5, 1990, now U.S. Pat. No. 5,108,951 and of Ser. No. 07/948,690, filed Sep. 22, 1992, titled METHOD FOR FORMING A METAL CONTACT.

The present application also contains subject matter in common with Ser. No. 08/160,686, filed on even date herewith, titled INTEGRATED CIRCUIT STRUCTURE AND METHOD, the disclosure of which is hereby expressly incorporated by reference.

All of the applications stated above are owned by the assignee of the present application, and are hereby expressly incorporated by reference.

BACKGROUND OF THE INVENTION

1. Field of the Invention

The present invention relates generally to the formation of contacts in integrated circuits, and more specifically to a method for forming interlevel aluminum contacts.

2. Description of the Prior Art

In semiconductor integrated circuits, formation of metal interconnect layers is important to the proper operation of these devices. Metal interconnect signal lines make contact to lower conductive layers of the integrated circuit, including the surface of the silicon substrate, through vias in an insulating layer. For best operation of the device, the metal used to form the interconnect layer should completely fill the via.

Because of its physical and electrical properties, aluminum is especially suited for fabrication of metal interconnect lines in integrated circuits. However, the sputtering process used to apply aluminum thin film layers to an integrated circuit generally results in less than ideal filling of contact vias. Large aluminum grains tend to form on the upper surface of the insulating layer. Those grains which form at the edges of the contact via tend to block it before aluminum has a chance to completely fill the via. This results in voids and uneven structures within the via.

This problem is especially acute as integrated circuit devices are fabricated using smaller geometries. The smaller contacts used in these devices tend to have a larger aspect ratio (height to width ratio) than larger geometry devices, which exacerbates the aluminum filling problem.

The uneven thickness of the aluminum layer going into the via, caused by the step coverage problem just described, has an adverse impact on device functionality. If the voids in the via are large enough, contact resistance can be significantly higher than desired. In addition, the thinner regions of the aluminum layer will be subject to the well known electromigration problem. This can cause eventual open circuits at the contacts and failure of the device.

Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because the sloped sidewalls consume too much area on a chip.

Even with these techniques, the problems of completely filling a via with aluminum are not solved. In part this is because aluminum is deposited at temperatures which tend to encourage fairly large grain sizes. Voids and other irregularities within the contact continue to be problems with current technologies.

One technique which has been proposed to overcome the via filling problem is to deposit the aluminum interconnect layers at a temperature between 500° C. and 550° C. At these temperatures, the liquidity of the aluminum is increased, allowing it to flow down into the vias and fill them. This technique is described, for example, in DEVELOPMENT OF A PLANARIZED Al—Si CONTACT FILLING TECHNOLOGY, H. Ono et al, June 1990 VMIC Conference proceedings, pages 76–82. This references teaches that temperatures below 500° C. and above 550° C. result in degraded metal filling of contact vias. It is believed that use of such a technique still suffers from problems caused by large grain sizes.

Another technique for improving metal contact step coverage is described in U.S. Pat. No. 5,108,951 issued to Chen et al, entitled METHOD FOR FORMING A METAL CONTACT. This patent describes a technique for depositing aluminum at low deposition rates within a specified temperature range. The temperature is ramped up from a temperature below approximately 350° C. while aluminum is being deposited. The teachings of this patent provide for deposition of the majority of the depth of the aluminum layer at a temperature between approximately 400–500° C. at relatively low deposition rates.

The teachings of the Chen patent provide improved step coverage deposition for aluminum contacts. However, the described technique still suffers from random voiding, which is believed to be caused by relatively large grain sizes, or initial film nucleation which are deposited at the temperatures described.

Many other variations to the deposition of aluminum have been proposed and used in integrated circuit devices. Until now, all have suffered to some degree from less than ideal via filling. Because of the nature of the deposition process, it appears that relatively minor modifications in the technology used to form the aluminum interconnect can have important effects on the end result. What is heretofore lacking is a complete process which adequately provides for complete aluminum fill of the contact via.

It would be desirable to provide a technique for depositing aluminum thin film layers on an integrated circuit so as to improve coverage in contact vias. It is further desirable that such a technique be compatible with current standard process flows.

SUMMARY OF THE INVENTION

Therefore, according to the present invention, a method for forming an aluminum contact through an insulating layer includes the formation of an opening. A barrier layer is formed, if necessary, over the insulating layer and in the opening. A thin refractory metal layer is then formed over the barrier layer, and aluminum deposited over the refractory metal layer. Proper selection of the refractory metal layer and aluminum deposition conditions allows the aluminum to flow into the contact and completely fill it. Preferably, the aluminum is deposited over the refractory metal layer without breaking vacuum.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

As is well known in the art, the term "aluminum", when referring to metal deposited as conductive interconnect for integrated circuits, typically means aluminum alloyed with small amounts of other materials rather than pure aluminum. For example, up to a few percent of silicon and/or copper are typically alloyed with the deposited aluminum in order to improve the physical characteristics of the interconnect layer. Other alloys, using a small percentage of other materials, are well known in the art. Consistent with this usage of the term, "aluminum" as used herein is intended to apply to such typical alloys as well as pure aluminum.

Figure 1:
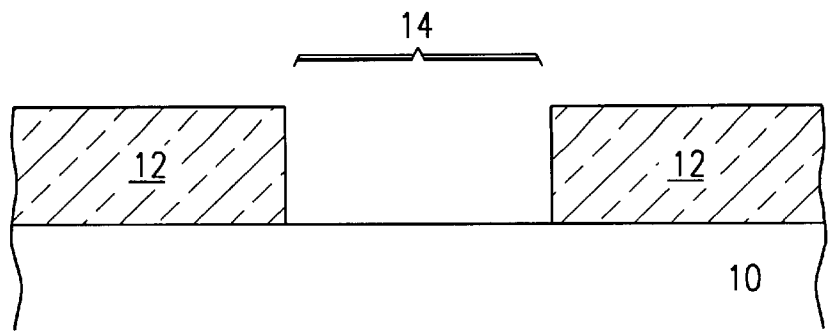
FIGS. 1–5 illustrate a preferred method for forming interlevel aluminum contacts according to the present invention.

Referring to FIG. 1, a contact is to be formed to a conductive structure in a substrate 10. As used in this description, the substrate 10 may be an actual silicon monocrystalline substrate, or may refer to any number of conductive and insulating layers overlying such a monocrystalline substrate. Insofar as the present invention is concerned, the same techniques can be applied to contacts to the silicon substrate, or to any other underlying conducting layers.

An insulating layer 12 is formed over the substrate 10 using well known techniques, and an opening 14 is formed in the insulating layer 12. Device fabrication to this point is wholly conventional, and well known to those skilled in the art.

Figure 2:
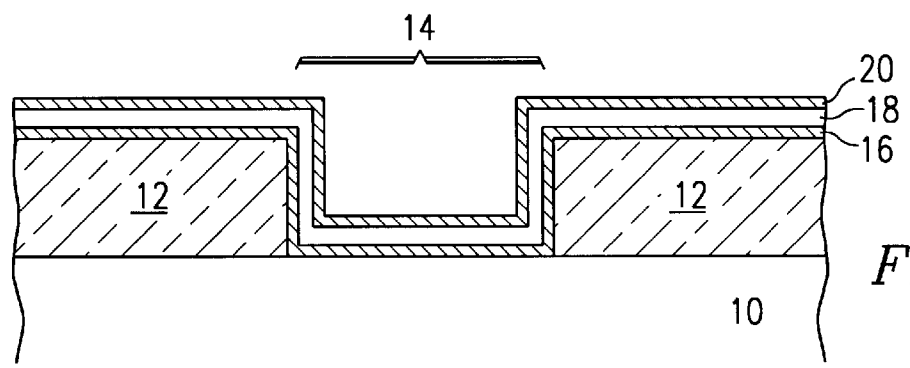

Referring to FIG. 2, a layer 16 of refractory metal, such as titanium, is formed over the device and in the opening. Physical vapor deposition (PVD) is preferably used. A layer of titanium nitride 18 is formed over the titanium layer, followed by a second titanium layer 20. The three layers 16, 18, and 20 are preferably deposited without a vacuum break between layers, in a single or multiple chamber sputtering machine. These layers are preferably deposited at a temperature between approximately 50° and 500° C.

Figure 3:
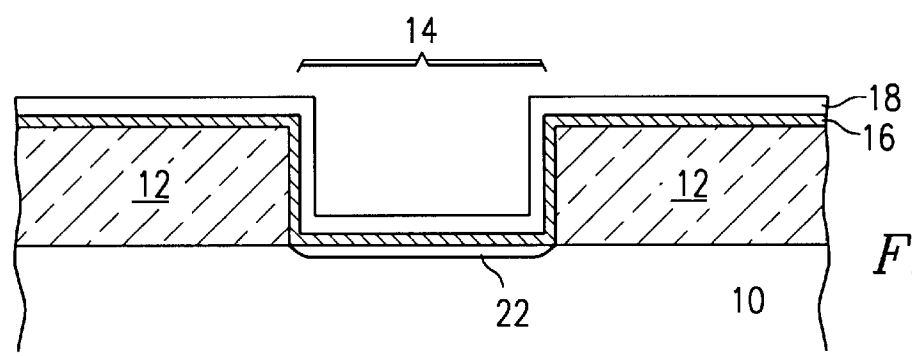

Referring to FIG. 3, the device is then subjected to a well known rapid thermal processing (RTP) step in a nitridation atmosphere, which converts the upper titanium layer 20 to titanium nitride. This step is preferably performed at a temperature between approximately 550° and 850° C. This results in the thickened nitride layer 18 shown in FIG. 3. As is known in the art, a good barrier layer greatly enhances the quality and reliability of the contact, and this sequence of steps provides a superior barrier layer. Other techniques for forming a good barrier layer can be substituted into the process if desired.

The RTP step also causes the lower titanium layer 16 to form a silicide region 22 with silicon exposed in the bottom of the contact opening 14. This will be the case with a contact made to a monocrystalline silicon substrate, or other silicon layer having silicon atoms free to alloy with the titanium. If the underlying layer contains no silicon, such a silicide layer 22 will not, of course, be formed.

Figure 4:
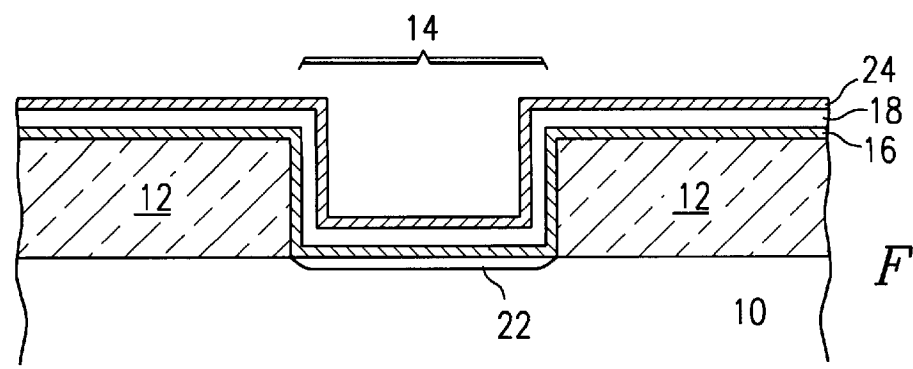

The wafer containing the device is then loaded into a multi-chamber sputtering machine. As shown in FIG. 4, a thin layer of titanium 24 is deposited over the device, preferably at a relatively low temperature of about 0° to 375° C. The titanium layer 22 preferably has a thickness of between approximately 50Å and 600Å. The thickness of this layer will depend primarily on the size and aspect ratio of the opening 14.

Figure 5:
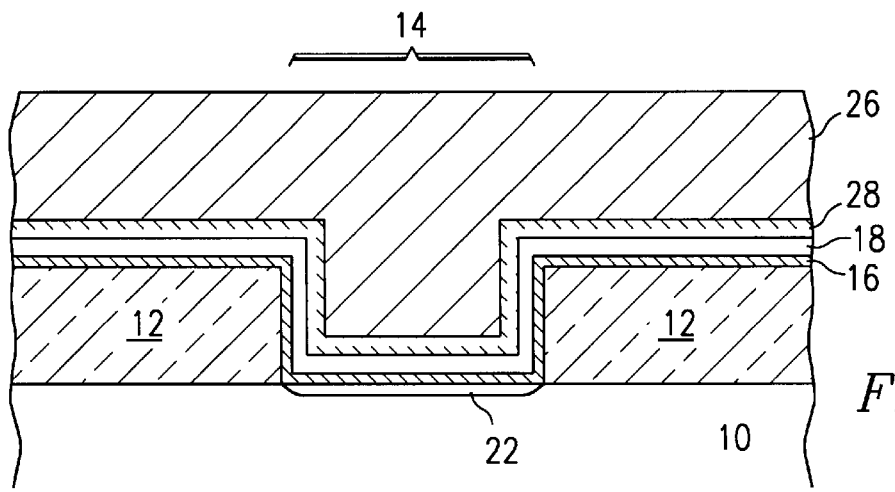

Referring to FIG. 5, the wafer is then moved into an aluminum deposition chamber without breaking vacuum. A thin layer of aluminum is preferably applied at a low temperature of about 0° to 300° C. using a conventional sputtering method. This layer preferably has a thickness of between about 500 Å and 2500 Å. The wafer is then moved into another chamber, having an elevated temperature of approximately 400° to 550° C., without breaking vacuum. Aluminum is then deposited immediately with a relatively slow deposition rate, preferably between approximately 20 and 50 Å/sec. This results in a thicker aluminum layer 26, which fills the opening 14 and forms a planar layer over the entire chip. The thickness of this layer 26 preferably ranges from about 2500 Å to the full thickness of the layer to be deposited. As is known in the art, this thickness can have a wide range depending on device design considerations, and typically is about 5000 Å to 10,000 Å. After about 2000 Å to 7000 Å have been deposited, the deposition rate can be increased if desired. By this point, the opening 14 has been substantially filled, and a faster deposition rate will have little or no effect on the ultimate planarity of the aluminum layer above the contact.

Alternatively, the wafer can remain in the same chamber, and the temperature can be ramped up from the initial deposition temperature to the final deposition temperature while aluminum is being deposited. It will be apparent to those skilled in the art that the use of a separate chamber has advantages in that no single chamber has to have its temperature ramped up and down, which increases the overall throughput of the machine.

The aluminum layer 26 forms a very planar layer in large part because of the thin titanium layer which was formed immediately prior to the aluminum deposition. This titanium layer acts to wet the surface of the wafer, increasing the surface mobility of the aluminum as it is deposited. The thin titanium layer alloys with the aluminum layer to form an aluminum/titanium alloy layer 28, with the original titanium layer 24 being substantially completely consumed. If the titanium layer 24 is relatively thick, only the upper portions will be converted to aluminum/titanium alloy.

Other refractory metals can be used in place of titanium, but titanium appears to provide superior results in terms of planarization and barrier formation. The formation of the thin barrier is preferably in situ, with no exposure to air between deposition of the thin metal layer 24 and the overlying aluminum layer 26. This appears to enhance the wetability of the aluminum as it is deposited over the underlying layers, improving the surface mobility of the aluminum and causing it to preferentially migrate into the opening and form a planar surface even while filling the opening. It is believed that even a small amount of oxide forming on the thin titanium layer interferes with this process, so the in situ deposition is strongly preferred.

Figure 6:
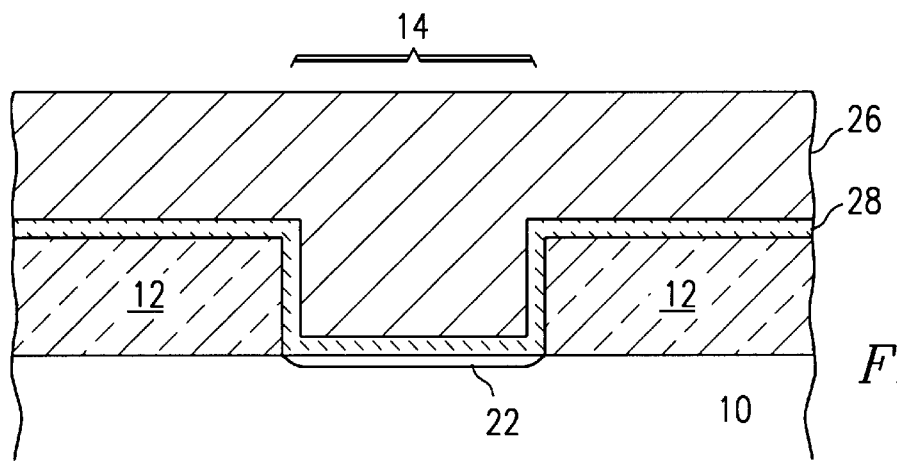
FIG. 6 illustrates an interlevel contact formed according to a preferred alternative method of the present invention.

Referring to FIG. 6, an alternative deposition technique is illustrated. This approach is suitable for use with second level metal deposition, and in other instances where the contact is not made to an underlying silicon layer. In these cases, it may not be necessary to form the barrier layer described above, formed from layers 16, 18, and 20. Thus, the structure shown in FIG. 6 illustrates the formation of the thin titanium layer 24 directly on the insulating layer 12 and in the opening. This layer is consumed as before to form a thin aluminum/titanium alloy layer 28 underneath the aluminum. As before, for thicker layers of titanium, only the upper portions of the layer will be converted to alloy, leaving a thin layer of relatively pure titanium beneath. In the alternative, a barrier of refractory metal (not shown in FIG. 6) can be deposited before the thin titanium layer 24, and it is not necessary that this layer be a superior barrier layer as was the layer described above in connection with FIG. 3.

Figure 7:
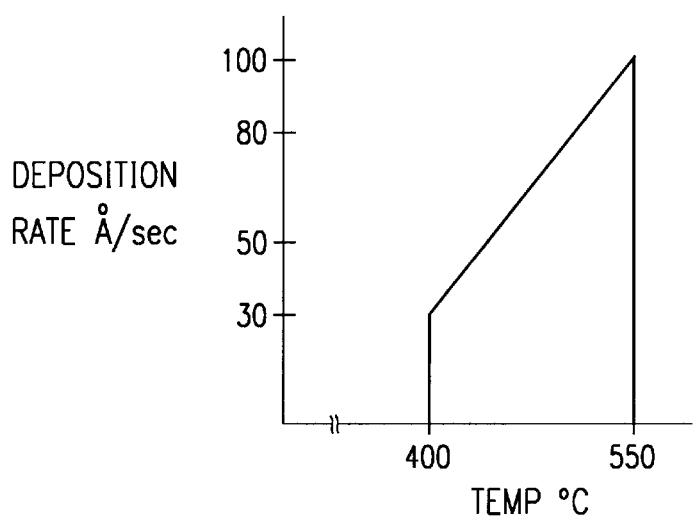
FIG. 7 is a diagram illustrating preferred process conditions for formation of an interlevel aluminum contact according to the present invention.

The diagram of FIG. 7 illustrates the preferred process conditions obtained during deposition of the aluminum layer. After the wafer is moved into the second (heated) chamber for aluminum deposition, the temperature and deposition rate preferably fall within the outline of the diagram. In the alternative embodiment, in which the wafer is heated while still in the first aluminum deposition chamber, the diagram illustrates the ranges of temperatures and depositions rates which is reached after the heating of the wafer is completed. Other deposition rates and temperatures may be used, especially after several thousand angstroms of aluminum have been deposited, at which point the opening should be substantially filled with aluminum.

After deposition of the aluminum layer, processing of the device proceeds in accordance with known prior art principles. The aluminum layer is patterned and etched to define interconnect. Further interconnect layers can be formed at higher levels, using the described techniques or prior art approaches. Because the aluminum layer is extremely planar, even over the contact, it is possible to stack contacts directly on top of each other without difficulty.

The described method, and resulting structure, results in a superior aluminum contact which completely fills the opening and is planar above it. Although many parts of the method are similar to previous techniques, the unique combination of steps and conditions described above results in a reproducible, manufacturable contact which is notably superior to those previously obtainable in the prior art. This is especially true for the manufacture of increasingly small contact openings.

While the invention has been particularly shown and described with reference to a preferred embodiment, it will be understood by those skilled in the art that various changes in form and detail may be made therein without departing from the spirit and scope of the invention.

What is claimed is:

1. A method for forming an interlevel aluminum contact for an integrated circuit device, comprising the steps of:

forming an opening through an insulating layer to expose a conducting structure;

forming a barrier layer over the insulating layer and extending into the opening to cover the conducting structure;

forming an upper layer of refractory metal over the barrier layer to a thickness of between approximately 50 Å and 600 Å; and depositing aluminum over the upper refractory metal layer at a temperature and rate which maximizes surface mobility of the aluminum, allowing it to completely fill the opening.

2. The method of claim 1, wherein the step of depositing aluminum comprises the steps of:

forming a first aluminum layer at a temperature of less than approximately 375° C.;

increasing the temperature of the device to a temperature between approximately 400° C. and 550° C.; and during the temperature increasing step, continuing to deposit aluminum over the first aluminum layer at a rate between approximately 30 and 50 Å/sec.

3. The method of claim 2, further comprising;

after the continuing to deposit step has deposited approximately 2000 Å of aluminum, increasing the deposition rate.

4. The method of claim 1, wherein the upper refractory metal layer comprises titanium.

5. A method for forming an interlevel aluminum contact for an integrated circuit device, comprising the steps of:

forming an opening through an insulating layer to expose a conducting structure;

forming an upper layer of refractory metal, over the insulating layer and extending into the opening to cover the conducting structure, to a thickness of greater than approximately 50 Å and less than approximately 600 Å; and depositing aluminum over the upper refractory metal layer at a temperature and rate which maximizes surface mobility of the aluminum, allowing it to completely fill the opening.

6. The method of claim 5, wherein the step of depositing aluminum comprises the steps of:

forming a first aluminum layer at a temperature of less than approximately 375° C.;

increasing the temperature of the device to a temperature between approximately 400° C. and 550° C.; and during the temperature increasing step, continuing to deposit aluminum over the first aluminum layer at a rate between approximately 30 and 50 Å/sec.

7. The method of claim 6, further comprising;

after the continuing to deposit step has deposited approximately 2000 Å of aluminum, increasing the deposition rate.

* * * * *